US005751235A

United States Patent [19]

Hicok et al.

[11] Patent Number: 5,751,235

[45] Date of Patent: May 12, 1998

[54] SYSTEM AND METHOD FOR ENHANCING JOYSTICK PERFORMANCE

[75] Inventors: Gary Hicok, Mesa; Kenneth Potts, Gilbert; Scott Harrow, Scottsdale, all of Ariz.

[73] Assignee: VLSI Technology, San Jose, Calif.

[21] Appl. No.: 653,619

[22] Filed: May 24, 1996

[51] Int. Cl.[6] .......... H03M 1/06

[52] U.S. Cl. .......... 341/140; 341/118

[58] Field of Search .......... 341/118, 140, 341/155

[56] References Cited

U.S. PATENT DOCUMENTS 4,496,935 1/1985 Inoue et al. .......... 341/118
4,903,023 2/1990 Evans et al. .......... 341/120
4,933,675 6/1990 Beard .......... 341/110
5,134,395 7/1992 Stern .......... 341/20
5,160,918 11/1992 Saposnik et al. .......... 340/709
5,196,851 3/1993 Patel et al. .......... 341/140
5,266,951 11/1993 Kuegler et al. .......... 341/120

*Primary Examiner*—Marc S. Hoff
*Attorney, Agent, or Firm*—LaValle D. Ptak

[57] ABSTRACT

A joystick system is designed to provide a modified digital representation of the setting of a joystick potentiometer. The system operates to compensate for non-linearities and offsets in the joystick response, or may be used to enhance or vary the joystick response to a non-linear form. This is accomplished by supplying the output voltage of the joystick to an analog-to-digital converter, the output of which then is supplied to a lookup table. The lookup table output is provided to a counter. In one mode of operation, the counter counts down to zero at some multiple of a sample rate. When the counter reaches a zero count, the time interval representative of the joystick position is indicated; and the corrected or enhanced position is indicated by this output. In an alternative mode of operation, the counter is used as a data latch; and the corrected or enhanced joystick position is digitally read directly from the data latch where the data remains until the next sample cycle from the joystick position occurs.

6 Claims, 1 Drawing Sheet

SYSTEM AND METHOD FOR ENHANCING JOYSTICK PERFORMANCE

RELATED APPLICATION

This application is related to co-pending application Ser. No. 08/653,255 filed on even date herewith and assigned to the same assignee.

BACKGROUND

Many computer games have been developed using programs which interface with spatial manipulation of one or more "joysticks" in the form of analog potentiometers. The joystick swings through a range on the potentiometer which is used to set the time delay of a one-shot multi-vibrator whenever the player decides to select that setting of the potentiometer. When multiple potentiometers are used, the same approach is used to obtain the setting from each of the potentiometers. Typically, four orthogonally arranged potentiometers are employed in a joystick configuration to obtain four related settings, each of which sets a separate one-shot multi-vibrator to establish a different time delay, depending upon the different positions of the potentiometers at the time the player of the program requests a readout of the setting.

Since prior art joystick game inputs utilize the R/C analog time delay of a one-shot multi-vibrator, accuracy of the potentiometer output readout may be imprecise or inconsistent. The readings vary particularly with changes in temperature and with inherent variations in components during manufacturing. In addition, a relatively large component count for each of the one-shot multi-vibrators is required for such a system. The component count and the manufacturing costs for both the components and the assembly into the completed system cause such systems to be relatively expensive.

Another problem which exists with at least some analog joystick controls used with personal computers is that the simple linear potentiometer may produce non-linear characteristics. Such characteristics are produced as a result of the physical nature of the system and the manner in which the wiper moves across the potentiometer resistor. In addition, with the wide variety of different analog potentiometer joysticks on the market, responses may vary from stick to stick. Some corrections of non-linear characteristics are provided by software; but no hardware corrections which satisfy this function of correcting non-linear characteristics exist. In addition, for some games, it may be desirable intentionally to produce a pre-established non-linear response characteristic to create a custom joystick "feel".

It is desirable to provide a system for providing the input from an analog joystick potentiometer which corrects for or enhances non-linear characteristics of the joystick position.

SUMMARY OF THE INVENTION

It is an object of this invention to provide an improved system for obtaining a signal representative of a potentiometer position.

It is another object of this invention to provide an improved digital system for providing an output indicative of the setting of a potentiometer.

It is an additional object of this invention to provide an improved digital system for correcting or enhancing non-linear characteristics of the position of a joystick potentiometer.

It is a further object of this invention to provide an improved digital system for providing an output indicative of the position of a joystick potentiometer which is compatible with conventional analog systems, and which also may be operated with digital systems.

In accordance with a preferred embodiment of the invention, a system provides a digital representation of the setting of a potentiometer. This is accomplished by employing an analog-to-digital converter with an input coupled with the source of analog signals from a potentiometer. A digital lookup table is coupled with the output of the analog-to-digital converter, and produces a digital output representative of translated digital signals from the analog-to-digital converter. A digital counter is coupled to the output of the lookup table to be set with a count from the table which corresponds to a corrected or enhanced position of the potentiometer setting. A clock circuit is coupled with the counter to cause the counter to count down to an initial count, whereupon an output signal is produced corresponding to the count in the counter. Since the count in the counter corresponds to the setting of the potentiometer, the time required for the countdown corresponds to the potentiometer setting in a manner compatible with an R/C multi-vibrator timer. If the time interval countdown is not required, the output counter is operated as a data latch directly to provide a digital representation of the potentiometer setting.

DETAILED DESCRIPTION

Figure 1:
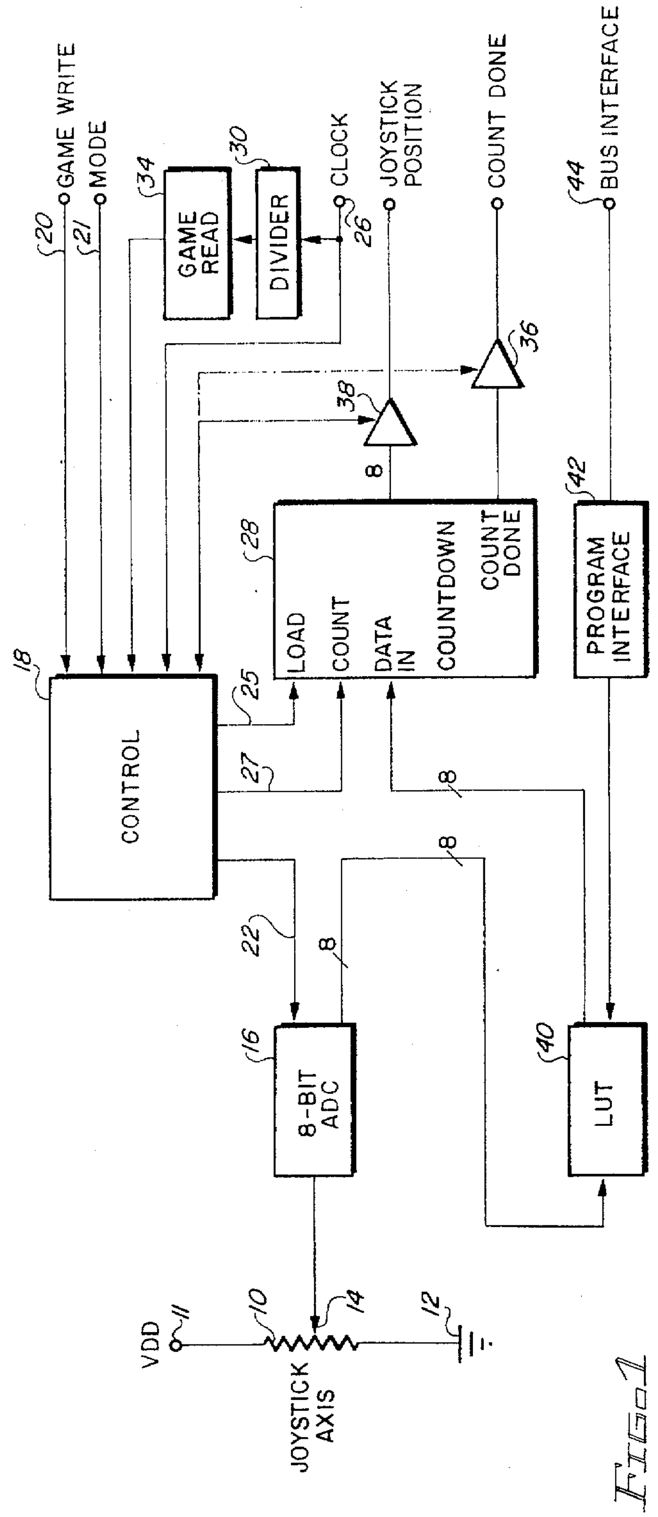
FIG. 1 is a block diagram of a preferred embodiment of the invention.

Reference now should be made to the drawing, in which FIG. 1 is a block diagram of a preferred embodiment of the invention for converting the analog information of a joystick potentiometer to a corrected or enhanced digitized form. As illustrated in FIG. 1, the joystick potentiometer 10 is connected between a source of supply voltage 11 VDD and ground 12. The wiper or output 14 of the potentiometer 10 (the joystick axis) is positioned by the joystick lever (not shown) in a conventional manner. As is well known, the position of the wiper 14 on the potentiometer causes a voltage to be supplied which is representative of the position between the maximum voltage at 11 and the ground potential at 12. Because the use of analog joystick potentiometers for computer games is well known, the various controls and interconnections between such joysticks and other portions of a host computer game are not shown, since these various controls and circuits are standard. The additions which are provided by the preferred embodiment of the invention, however, are shown in detail in FIG. 1.

The output of the potentiometer at 14 is an analog voltage, as described above. This output is supplied to the input of an eight-bit analog-to-digital converter (ADC) 16. The ADC 16 continuously provides an eight-bit digital representation of the analog voltage supplied to it from the output 14 of the joystick potentiometer 10. For computer games, when the position of the joystick is to be utilized or supplied to the game to supply some function, a game write pulse 20 is produced by the host. This pulse is shown in FIG. 1 as being supplied to a control circuit 18, the operation of which is controlled by clock signals on an input 26, typically from the computer system clock; so that the game write input 20 is synchronized or coordinated with pulses from the clock input 26.

Whenever a game write pulse 20 is provided to the control circuit 18, coincidence with a clock pulse from the input 26 causes a transfer signal to be applied over a lead 22 to the analog-to-digital converter 16. When this occurs, the eight-bit parallel output from the ADC 16 is supplied over a bus 24 to the data inputs of a programmable lookup table 40. The lookup table 40 then either passes the digital output unchanged, or as modified by a pre-established program determined by a program interface circuit 42, to the data inputs of a countdown counter 28. This occurs simultaneously with a load pulse from the control circuit 18 applied over a lead 25 to the counter 28, followed by successive countdown clock pulses applied over a lead 27 from the control circuit 18. The pulses applied over the lead 27 are synchronized by the clock circuit 26 operating through the control circuit 18.

In summary, whenever a game write pulse or signal 20 is obtained, the current status of the joystick position at the slider 14 on the potentiometer 10 is transformed into digital form by the analog-to-digital converter 16 and is loaded (as changed or enhanced) into the countdown counter 28. The countdown immediately takes place toward a counter "zero" or initial value.

At the same time, pulses from the clock circuit 26 are supplied through a divider 30 to produce game read signals or sample signals at a "game read" terminal or circuit 34. As a result of the divider 30, it is apparent that the counter 28 counts down to zero or its initial value at some multiple of the sample rate obtained from the divider 30.

When the counter 28 reaches its final or zero count, a signal is applied to the input of a gated amplifier 36, which is enabled to produce a "countdown" output upon the occurrence of the next game read signal from the circuit 34 via the control circuit 18. The output from the gated amplifier 36 signals that the timed interval is over. The host system keeps track of the time interval from the initial sample taken at the time of initiation of the game write pulse 20 to the bit assertion from the output of the gated amplifier 36, thereby resolving the joystick position in terms of a time interval comparable to the time interval obtained from the prior art R/C based multi-vibrator circuits. The time delay between the game write pulse 20 to the countdown output from the gated amplifier 36 is comparable to that of prior art analog systems. The system of FIG. 1 provides an accurate and consistent corrected and enhanced digitized time interval through the use of the countdown counter 28.

The circuit also is capable of directly providing a parallel eight-bit digital output which may be utilized in systems capable of operation directly from the digital information obtained from the analog-to-digital converter 16. This is accomplished by an additional control signal applied over a lead 21 to the control circuit 18. This is a "model" signal used to cause the control circuit 18 to operate either in a countdown mode applying clock pulses over the lead 27, as described previously, or simply to load the counter 28, in the manner described previously, without the countdown. If the time interval measurement is the mode which is selected, the operation is identical to the operation described above. The game read signal is shown as being applied through the control circuit 18, and from there to the gate of the gated amplifier 36 for this mode of operation.

When the circuit, however, is operated in its fully digital mode, as determined by a signal on the lead 21, no count pulses or clock pulses are applied over the lead 27 from the control circuit 18 after the eight-bit digital information from the lookup table 40 is loaded in the counter 28 by a pulse over the lead 25. The counter 28 operates as a latch circuit in this mode and retains the stored digital information until the next sample of the ADC 16 is made. In this mode of operation, when the game read signal from the circuit 34 is applied through the control circuit 18, the pulse obtained on the output of the control circuit 18 is applied to a gated buffer amplifier circuit 38, which has an eight-bit parallel input applied through it to produce an eight-bit parallel output representative of the digital joystick position for utilization in the game computer as a direct digital input.

Figure 2:
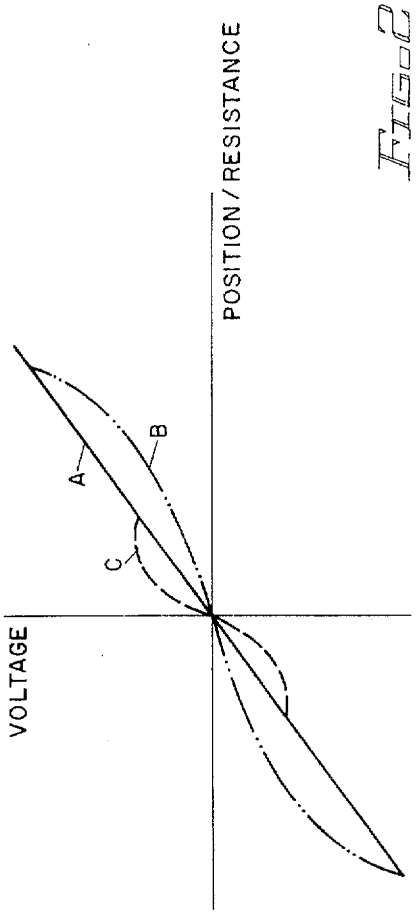
FIG. 2 is a waveform diagram useful in explaining the operation of the embodiment of FIG. 1.

FIG. 2 illustrates some of the variations of the correction or enhancement which may be applied to the digital representation of the position of the wiper 14 on the potentiometer 10 as a result of the lookup table 40. For a linear representation, the curve "A" shown in FIG. 2 is ideally obtained from movement of the wiper 14 along the length of the resistive portion of the potentiometer 10 between its ends. If no correction or enhancement is to be provided, the eight-bit output from the ADC 16 is passed, without translation, directly through the lookup table 40 to the data input of the counter 28. In an ideal situation, this should result in a representative voltage versus position/resistance for the wiper 14 shown by the waveform A of FIG. 2.

If, however, the particular joystick potentiometer 10 produces a non-linear output, or if an enhanced output variation is desired, translation control signals from a bus interface 44 in the host system are applied to the program interface 42. The interface 42 then causes the address locations of the lookup table 40 for each digital representation obtained from the ADC 16 to be modified. Depending upon the changes which are made by the program interface 42 and stored in the lookup table 40, a variety of representative curves or waveforms for different wiper positions of the wiper 14 in the joystick potentiometer 10 may be obtained. Two such variations are illustrated in FIG. 2 by the waveforms "B" and "C", respectively.

It should be noted that exaggerated waveforms "B" and "C" are shown to illustrate the modifications which may be obtained from the lookup table 40. It should be noted that the variations which are caused by the different addresses in the lookup table 40 may, for any given system, be such as to produce a linear output such as the waveform "A" of FIG. 2 for a faulty or non-linear joystick potentiometer 10. This is a determination which can be made during a test mode of operation of the system to program the lookup table 40 to cause a linear data input to be supplied to the counter 28, irrespective of variations or flaws in the output from the wiper 14 of a given potentiometer. On the other hand, the lookup table 40 may be employed to produce unusual or enhanced characteristics which cause either a "slowdown" or a "speed up" signal to be obtained, depending upon the particular position of the wiper 14 on the joystick potentiometer 10, thereby producing modified waveforms, such as those shown in waveforms "B" and "C" of FIG. 2.

The foregoing description of the preferred embodiments of the invention is to be considered as illustrative and not as limiting. Various changes and modifications will occur to those skilled in the art for performing substantially the same function, in substantially the same way, to achieve substantially the same result without departing from the true scope of the invention as defined in the appended claims.

What is claimed is:

1. A system for modifying a digital representation of the setting of a potentiometer including in combination:

an analog-to-digital converter having an input coupled with a source of analog signals from a potentiometer and having a digital output;

a digital lookup table coupled with the output of said analog-to-digital converter and producing a digital output therefrom representative of translated digital signals from said analog-to-digital converter;

a digital counter with the input thereof coupled to the output of said lookup table and having an output;

a control circuit coupled with said counter to load said counter with the output from said lookup table at a predetermined time;

a clock circuit coupled with said counter for supplying clock signals to cause said counter to count down to an initial value to produce an output signal on the output of said digital counter when said count down to said initial value is attained:

a sample device coupled with the output of said digital counter;

and a circuit coupled with said clock circuit for causing said sample device to sample said output from said digital counter at a predetermined rate which is at a lower frequency than the frequency of said clock signals.

2. The combination according to claim 1 wherein said initial value of said counter is a count of zero.

3. The combination according to claim 2 further including a program interface for modifying said digital lookup table.

4. The combination according to claim 1 further including a program interface for modifying said digital lookup table.

5. A system for modifying a digital representation of the setting of a potentiometer including in combination:

an analog-to-digital converter having an input coupled with a source of analog signals from a potentiometer and having a digital output;

a digital lookup table coupled with the output of said analog-to-digital converter and producing a digital output therefrom representative of translated digital signals from said analog-to-digital converter;

a digital latch circuit with the input thereof coupled to the output of said lookup table and having an output;

a control circuit coupled with said latch circuit to load said latch circuit with the output from said lookup table at a predetermined time;

a sample device coupled with the output of said latch circuit; and a circuit coupled with said sample device to sample said output from said latch circuit.

6. The combination according to claim 5 further including a program interface for modifying said digital lookup table.

* * * * *